United States Patent
Gauthier, Jr. et al.

(10) Patent No.: US 7,782,580 B2
(45) Date of Patent: Aug. 24, 2010

(54) STACKED POWER CLAMP HAVING A BIGFET GATE PULL-UP CIRCUIT

(75) Inventors: Robert J. Gauthier, Jr., Hinesburg, VT (US); Junjun Li, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 358 days.

(21) Appl. No.: 11/865,820

(22) Filed: Oct. 2, 2007

(65) Prior Publication Data
US 2009/0086391 A1    Apr. 2, 2009

(51) Int. Cl.
*H02H 9/00* (2006.01)
(52) U.S. Cl. .................... 361/56; 361/91.1; 361/111
(58) Field of Classification Search .................... 361/56, 361/91.1, 111
See application file for complete search history.

(56) References Cited

U.S. PATENT DOCUMENTS

| | | | | |
|---|---|---|---|---|
| 5,173,450 A | * | 12/1992 | Wei | 438/620 |
| 5,956,219 A | * | 9/1999 | Maloney | 361/56 |
| 6,552,886 B1 | * | 4/2003 | Wu et al. | 361/56 |
| 6,801,416 B2 | * | 10/2004 | Hatzilambrou et al. | 361/56 |
| 7,529,070 B2 | * | 5/2009 | Bhattacharya et al. | 361/56 |
| 2008/0012090 A1 | * | 1/2008 | Meiser et al. | 257/506 |

* cited by examiner

*Primary Examiner*—Stephen W Jackson
*Assistant Examiner*—Tien Mai
(74) *Attorney, Agent, or Firm*—Downs Rachlin Martin PLLC

(57) ABSTRACT

An electronic discharge (ESD) protection circuit for protecting an integrated circuit chip from an ESD event. The ESD protection circuit includes a stack of BigFETs, a BigFET gate driver for driving the gates of the BigFETs and a triggering the BigFET gate driver to drive the gates of the BigFETs in response to an ESD event. The BigFET gate driver includes gate pull-up circuitry for pulling up the gate of a lower one of the BigFETs. The gate pull-up circuitry is configured so as to obviate the need for a diffusion contact between the stacked BigFETs, resulting in a significant savings in terms of the chip area needed to implement the ESD protection circuit.

2 Claims, 3 Drawing Sheets

STACKED POWER CLAMP HAVING A BIGFET GATE PULL-UP CIRCUIT

FIELD OF THE INVENTION

The present invention generally relates to electrostatic discharge (ESD) protection circuits. In particular, the present invention is directed to a stacked power clamp having a BigFET gate pull-up circuit.

BACKGROUND

Electrostatic discharge (ESD) is a momentary and sudden electric current that flows when an excess of electric charge stored on an electrically insulated structure finds a path to another structure at a different electrical potential, such as ground. ESD, its power consumption and efficient use of semiconductor real estate to protect integrated circuits (ICs) are particularly serious concerns with microelectronic devices. In most cases, the ICs in these devices are not repairable if affected by an ESD event. The shrinking size of modern electronics demands that ICs, complete with ESD protection, fit into a small package.

It is common in IC design to include ESD protection, in the form of a "clamping" circuit, to the terminals that receive an operating voltage for driving an IC chip, or portion thereof. A voltage clamp ensures that a sudden surge in voltage from an ESD event can be safely discharged so that no damage results to the internal active devices of the integrated circuit. The clamping circuit, which holds the voltage across the power supply terminals to the nominal power supply voltage, often requires one or more relatively very large field-effect transistors, or "BigFETs," capable of discharging the electrical current produced from an ESD event that, however brief, can result in peak currents and voltages many times the operating voltage of the IC.

When an ESD potential occurs across the power supply and ground terminals, each BigFET is opened so as to conduct the ESD current, thereby clamping the power supply terminal voltage. Each BigFET is biased on when a gate driving circuit connected to the gate of that BigFET switches to a level to render the device conducting to rapidly discharge the ESD event. An RC timing circuit, also connected across the power supply and ground terminals, triggers the gate driving circuit during an ESD event.

Achieving performance gains while limiting power consumption requires aggressive scaling of transistor gate length, oxide thickness and supply voltage. Some conventional circuit applications, such as analog circuits and programmable fuses, require supply voltages greater than the native transistor voltage. These applications can create oxide reliability problems if classical RC-triggered power clamps are used for ESD protection of the high-voltage pins. Classical power clamps use a single thin oxide core or thick oxide I/O transistor (a BigFET) as the ESD current conducting device between VDD and ground. The gate oxide can potentially be damaged during high-voltage standby or during an ESD event.

FIG. 5 shows a conventional stacked power clamp 500 having a BigFET stack 504 made of two BigFETs 508, 512 electrically connected across VDD and ground pins 516, 520 via a middle node 524. A pair of inverter chains 528, 532, which are responsive to corresponding respective RC triggers 536, 540, drive the corresponding respective gates 508A, 512A of BigFETs 508, 512. In this design, inverter chains 528, 532 and RC triggers 536, 540 are connected across VDD and ground pins 516, 520 via middle node 524. As seen in FIG. 6, because the design of conventional power clamp 500 of FIG. 5 requires BigFET stack 504 to be connected to middle node 524, the physical instantiation 600 of this BigFET stack requires a diffusion contact region 604 between gates 508A, 512A. Because BigFETs 508, 512 need to be large to handle the high currents of an ESD event, diffusion contact region 604 is relatively very large and takes up quite a bit of chip area.

Stacked power clamps, i.e., power clamps having BigFETs connected in series with one another across the VDD and ground pins, are used for maximum gate reliability if no special high-voltage tolerant devices are available in the technology. Either thin oxide or thick oxide FETS may be used in the BigFET stack, depending on the applicable supply voltage. In a stacked power clamp, it would be preferred to lay out the stacked BigFETs in such a way that no diffusion contacts exist between the gates for significant area efficiency improvement. However, simply doing so for stacked NFET-based power clamps may cause serious turn-on delay in the bottom BigFET, because its gate will then be pulled up by the resistive voltage divider, whose large resistance (typically on the order of 500 kΩ) cannot quickly charge the high gate capacitance load.

SUMMARY OF THE DISCLOSURE

One implementation of the present invention is an electrostatic discharge (ESD) protection circuit for protecting an integrated circuit chip from an ESD event. The ESD protection circuit includes: a BigFET stack electrically connected between a high-voltage pin and a low-voltage pin of the integrated circuit chip, the BigFET stack including a first BigFET and a second BigFET connected in series with, and downstream of, the first BigFET without being electrically connected to a diffusion contact, the first BigFET including a first gate and the second BigFET including a second gate; a driver electrically connected to each of the first and second gates and configured to drive the first and second gates during the ESD event; and a trigger for detecting the ESD event and triggering the driver to drive the first and second gates in response to the ESD event.

Another implementation of the present invention is an electrostatic discharge (ESD) protection circuit for protecting an integrated circuit chip from an ESD event. The ESD protection circuit includes: a BigFET stack electrically connected between a high-voltage pin and a low-voltage pin, the BigFET stack including a first BigFET and a second BigFET connected in series with, and downstream of, the first BigFET, the first BigFET including a first gate and the second BigFET including a second gate; a driver electrically connected to each of the first and second gates and configured to drive the first and second gates during the ESD event, the driver including: a first output electrically connected to the first gate and providing a first voltage; a second output electrically connected to the second gate and providing a second voltage; and gate pull-up circuitry in electrical communication with the first output, the gate pull-up circuitry for controlling the second voltage as a function of the first voltage; and a trigger for detecting the ESD event and triggering the driver to drive the first and second gates in response to the ESD event.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
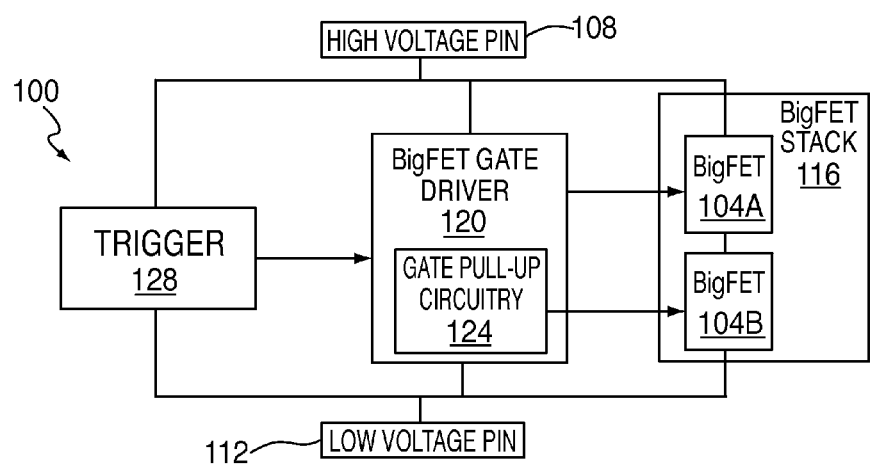
FIG. 1 is a high-level block diagram of a stacked power clamp made in accordance with the present disclosure.

Referring to the drawings, FIG. 1 shows an electrostatic discharge (ESD) power clamp 100 made in accordance with the present disclosure. ESD power clamp 100 includes a plurality high-current-capacity field-effect transistors (FETs) 104A-B, or "BigFETs," electrically connected in series with one another across a high-voltage pin 108 (e.g., a VDD pin) and a low-voltage pin 112 (e.g., a ground pin) to form a BigFET stack 116. In the manner discussed in the background section above, BigFET stack 116 provides a current path for discharging current from high-voltage pin 108 quickly during an ESD event. BigFETs 104A-B are relatively very large FETs, for example, having channel widths on the order of 2,000 μm to 9,000 μm in order to handle the large current present during an ESD event.

As described below in detail, ESD power clamp 100 includes a unique BigFET-gate driver 120 for driving the corresponding respective gates (not illustrated) of BigFETs 104A-B quickly and efficiently. In this connection, BigFET-gate driver 120 includes gate pull-up circuitry 124 for pulling up the gate of bottom BigFET 104B to avoid significant delays in opening the current path through BigFET stack 116 in response to an ESD event. BigFET-gate driver 120 is triggered by a trigger 128 that is suitably responsive to an ESD event. Two examples (200, 300) of ESD power clamp 100 having differing embodiments of pull-up circuitry 124 are described below in connection with FIGS. 2 and 3, respectively. Benefits of pull-up circuitry 124 are also described below in the context of the two exemplary ESD power clamps 200, 300 shown.

Figure 2:
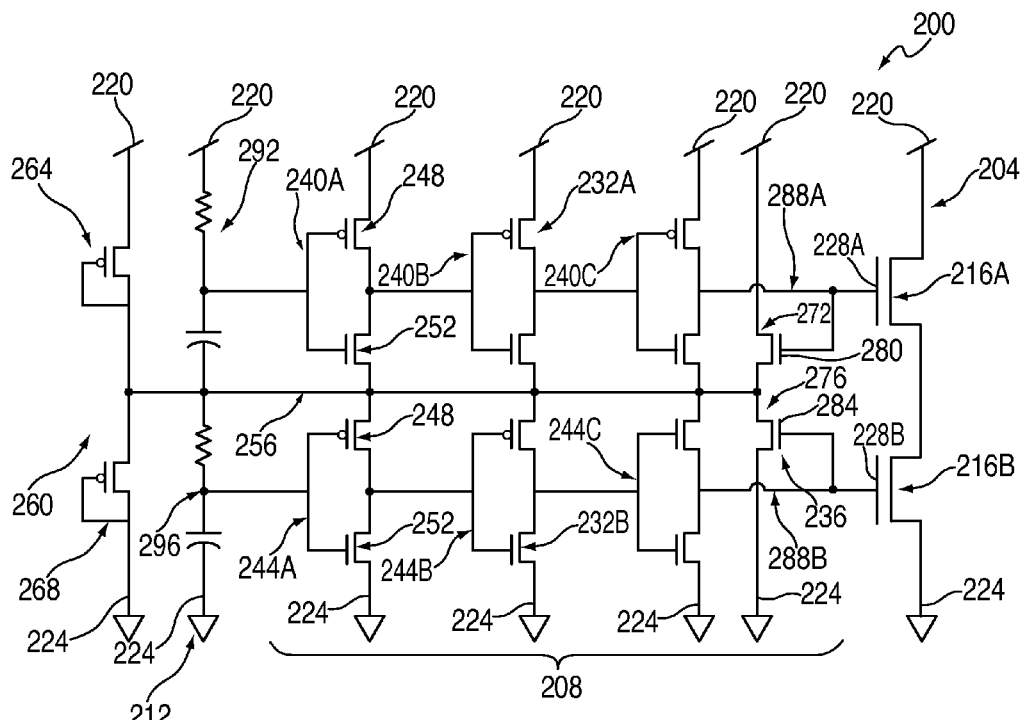
FIG. 2 is a schematic diagram of one embodiment of the stacked power clamp of FIG. 1.
Figure 4:
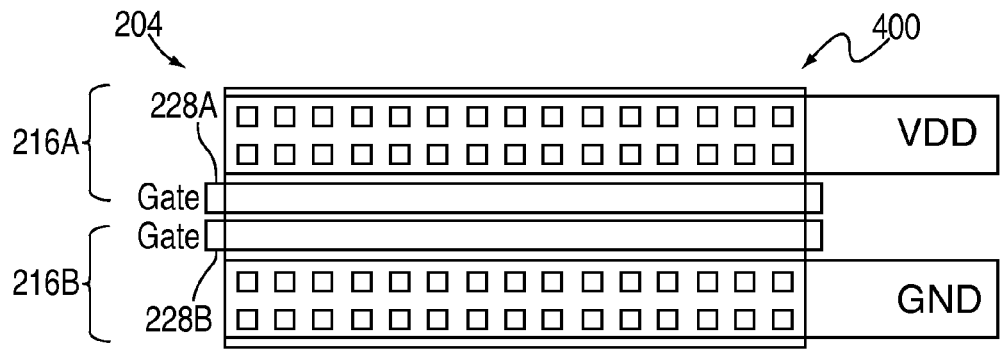
FIG. 4 is a representation of a physical instantiation of the BigFET stack of each of the BigFET stacks of the stacked power clamps of FIGS. 2 and 3 illustrating the small chip area needed to implement each BigFET stack.
Figure 5:
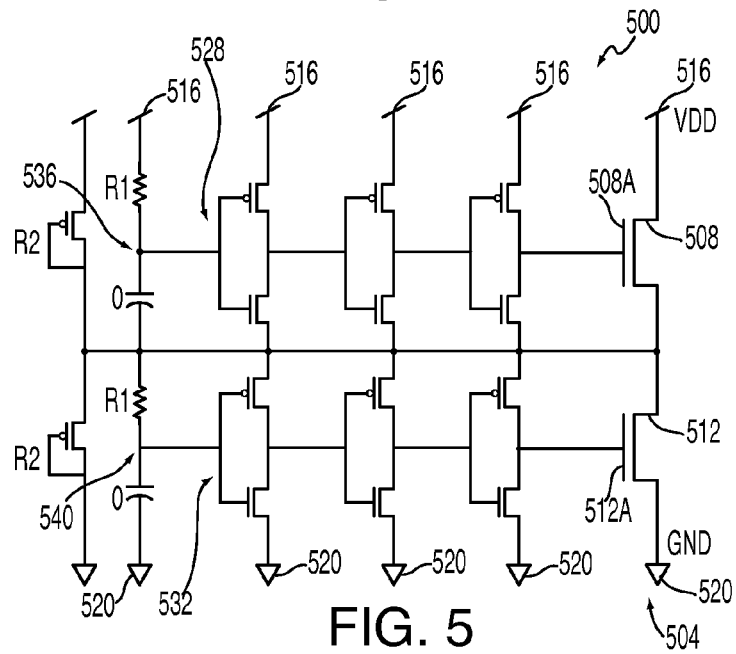
FIG. 5 is a schematic diagram illustrating a conventional stacked power clamp.
Figure 6:
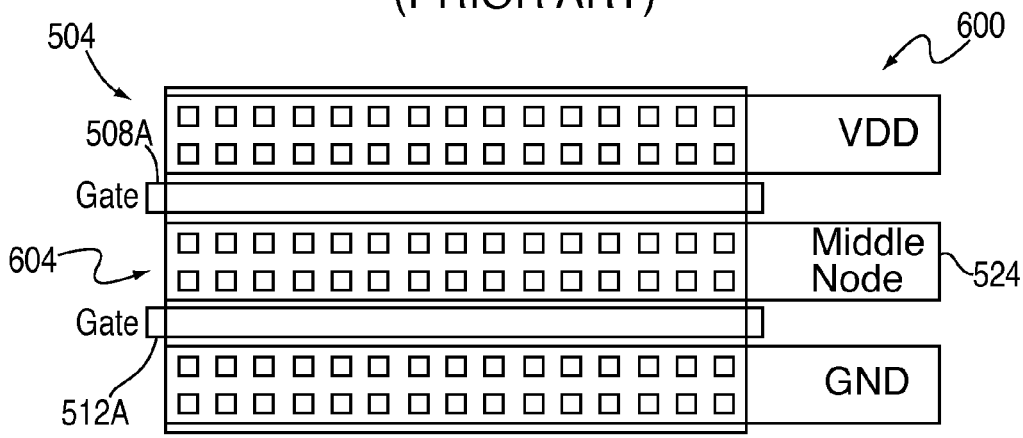
FIG. 6 is a representation of a physical instantiation of the BigFET stack of the conventional stacked power clamp of FIG. 5 illustrating the large chip area needed to implement the BigFET stack.

Referring now to FIG. 2, like ESD power clamp 100 of FIG. 1, ESD power clamp 200 of FIG. 2 includes a BigFET stack 204, BigFET-gate driver 208 and a trigger 212. In this example, BigFET stack 204 includes two BigFETs 216A-B electrically connected in series with one another between a high-voltage pin 220 and a low-voltage pin 224. As a result of the design of BigFET-gate driver 208, which does not need to provide a center node between BigFETs 216A-B, these BigFETs can be fabricated without diffusion contacts between their gates 228A-B. This is illustrated in FIG. 4. Referring to FIG. 4, which illustrates a physical instantiation 400 of BigFET stack 204, it is readily seen that without the need for a diffusion contact region between gates 228A-B of BigFETs 216A-B, the BigFET stack can be implemented in much less area (e.g., up to about 33% less area) than a conventional ESD power clamp that requires diffusion contacts. See FIG. 6 for comparison to FIG. 4. As described in the Background section above, FIG. 6 shows the implementation of a conventional BigFET stack 504 that requires a central diffusion contact region 604 for the needed middle node 524 (FIG. 5) of that design. As those skilled in the art will readily appreciate, BigFETs may be any suitable FET available in the technology for which ESD power clamp 200 is being designed, such as the NMOSFETs shown.

BigFET-gate driver 208 is electrically connected to gates 228A-B and drives these gates during an ESD event. In this example, BigFET-gate driver 208 includes two inverter chains 232A-B and gate pull-up feedback circuitry 236 for pulling up gate 228B of the bottom BigFET 216B. Each inverter chain 232A-B contains a corresponding respective plurality of inverters 240A-C, 244A-C that step up corresponding respective trigger signals (not shown) generated by trigger 212. As those skilled in the art will readily appreciate, while inverter chains 232A-B are shown, other circuitry that effectively steps up or is otherwise responsive to one or more trigger signals from trigger 212 may be used. That said, inverter chains 232A-B are simple to implement. In this example, each inverter 240A-C, 244A-C of the two inverter chains 232A-B includes a PMOSFET 248 and an NMOSFET 252. While this example shows each inverter chain 232A-B as having, respectively, three serially connected inverters 240A-C, 244A-C, those skilled in the art will readily appreciate that other numbers of inverters may be used to suit a particular design.

In the design shown, each inverter 240A-C of inverter chain 232A is electrically connected between high-voltage pin 220 and an intermediate node 256 having a voltage between the voltages of the high-voltage pin and low-voltage pin 224. Each inverter 244A-C of inverter chain 232B is electrically connected between intermediate node 256 and low-voltage pin 224. In this example, intermediate node 256 is powered by a voltage divider 260, which in this case is provided by two resistor-connected PMOSFETs 264, 268 electrically connected in series between high- and low-voltage pins 220, 224. In one example, the resistances of PMOSFETs 264, 268 are identical and are equal to 500 kΩ. Consequently, the voltage on intermediate node 256 is one-half of VDD on high-voltage pin 220 (assuming ground on low-voltage pin 224 is 0V). Of course, other resistive devices and resistance values can be used. In addition, voltage divider 260 need not be symmetrical as shown.

Gate pull-up feedback circuitry 236 comprises a pair of dummy-stacked NMOSFETs 272, 276, with NMOSFET 272 being electrically connected between high-voltage pin 220 and intermediate node 260 and NMOSFET 276 being electrically connected between intermediate node 260 and low-voltage pin 224. The gates 280, 284 of NMOSFETs 272, 276 are electrically connected to corresponding respective ones of outputs 288A-B of BigFET-gate driver 208. As those skilled in the art will understand, NMOSFETs 272, 276 connected in this manner serve as pull-up devices for bottom BigFET 216B.

In this example, trigger 212 is an RC trigger that includes a first resistor-capacitor pair 292 electrically connected between high-voltage pin 220 and intermediate node 256 and a second resistor-capacitor pair 296 electrically connected between the intermediate node and low-voltage pin 224. First resistor-capacitor pair 292 provides a trigger signal (not shown) to inverter chain 232A in response to an ESD event as a function of its RC time constant. Likewise, second resistor-capacitor pair 296 provides a trigger signal (not shown) to inverter chain 232B in response to the ESD event as a function of its RC time constant. In one example, the RC time constant for each of resistor-capacitor pair 292, 296 is about 1 μs.

Those skilled in the art will understand how to select resistance and capacitance values for resistor-capacitor pairs 292, 296 to achieve suitable RC time constants for the type of ESD under consideration.

During an ESD event where high voltage pin 220 rises to high (e.g. VDD) and low voltage pin 224 stays at low (e.g. GND), The trigger circuit 292 sets the output of the upper inverter chain output 288A to be VDD, turning on 216A and 272. Resistive divider 260 at the same time tries to pull the intermediate node 256 up to be VDD/2, and the lower inverter chain sets output 288B to be the same as node 256. Once 272 turns on, it helps to pull node 256 up. The voltage rise of node 256 turns on the other pull up transistor 276. Once both pull up transistors 272 and 276 are on, the intermediate node 256 is set to be VDD/2, the gate of transistor 216A and 216B are set to be VDD and VDD/2. Both BigFETs are therefore fully turned on and start to discharge ESD current.

Figure 3:
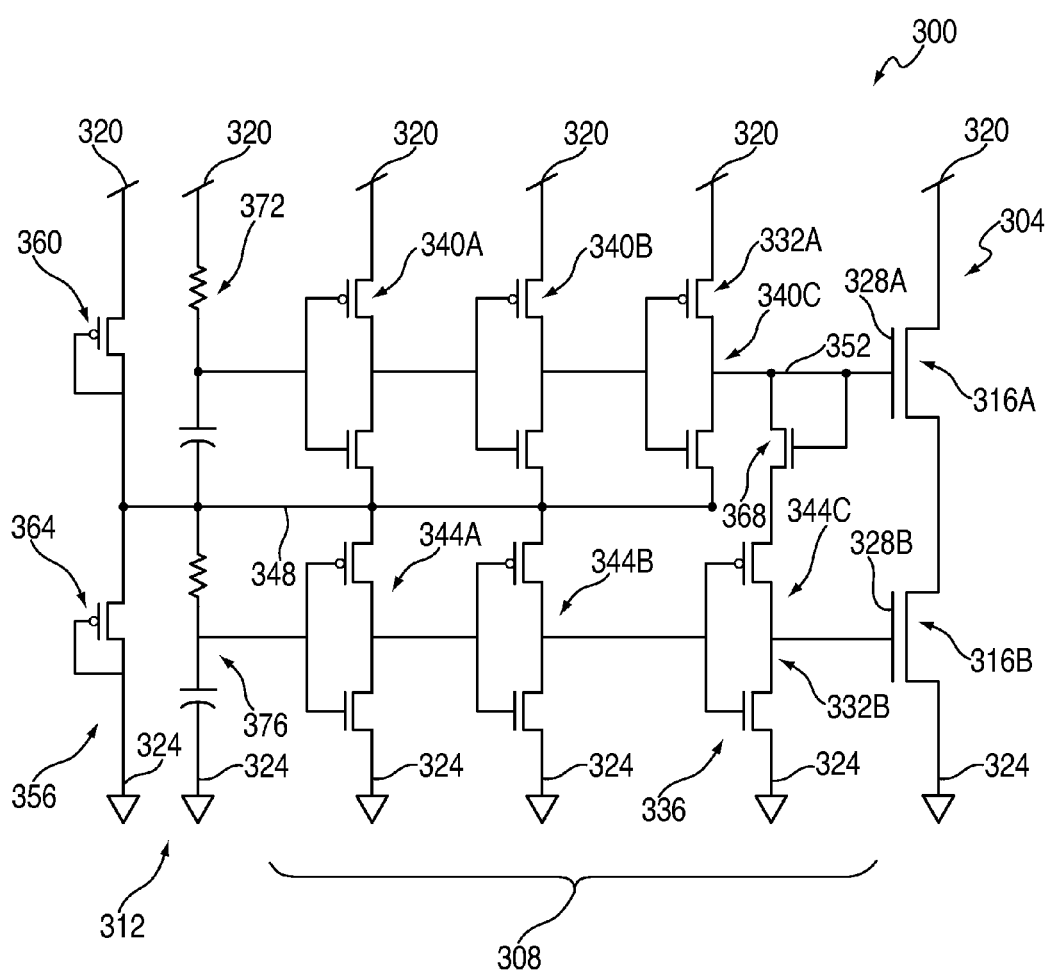
FIG. 3 is a schematic diagram of another embodiment of the stacked power clamp of FIG. 1.

In stacked power clamp design, the high-voltage pin (such as high-voltage pin 220 of FIG. 2) is not usually twice the operating voltage of the transistor used. For example, 1.5V transistors might be used to design a stacked power clamp to protect a 2V VDD pin. In this scenario, two stacked BigFETs would operate at 1V gate-to-source and drain-to-source voltages if wire resistance is neglected and the VDD clamping voltage is targeted at 2V. This significantly reduces the circuit performance, as none of the devices works in its saturation region. Hence, to achieve adequate discharge currents, Big-FETs having larger widths are required. FIG. 3 illustrates an alternative ESD voltage clamp 300 that addresses this specific condition and fully utilizes the capabilities of the BigFETs.

Referring now to FIG. 3, like ESD power clamps 100, 200 of FIGS. 1 and 2, respectively, ESD clamp 300 of FIG. 3 includes a BigFET stack 304, a BigFET-gate driver 308 and a trigger 312. In this example, BigFET stack 304 includes two BigFETS 316A-B electrically connected in series with one another between a high-voltage pin 320 and a low-voltage pin 324. Like ESD power clamp 200 of FIG. 2, the design of ESD power clamp 300 of FIG. 3 does not require a center node between BigFETs 316A-B. Consequently, these BigFETs can be fabricated without diffusion contacts between their gates 328A-B, just like BigFETs 216A-B of FIGS. 2 and 4. This allows ESD power clamp 300 to be implemented in much less area (e.g., up to about 33% less area) than a conventional ESD power clamp that requires diffusion contacts. As those skilled in the art will readily appreciate, BigFETs may be any suitable FET available in the technology in which ESD power clamp 300 will be used, such as the NMOSFETs shown.

BigFET-gate driver 308 is electrically connected to gates 328A-B and drives these gates during an ESD event. In this example, BigFET-gate driver 308 includes two inverter chains 332A-B and gate pull-up feedback circuitry 336 for pulling up gate 328B of the bottom BigFET 316B. Each inverter chain 332A-B contains a corresponding respective plurality of inverters 340A-C, 344A-C that step up corresponding respective trigger signals (not shown) generated by trigger 312. As those skilled in the art will readily appreciate, while inverter chains 332A-B are shown, other circuitry that effectively steps up or is otherwise responsive to one or more trigger signals from trigger 312 may be used. That said, inverter chains 332A-B are simple to implement. While this example shows each inverter chain 332A-B as having, respectively, three serially connected inverters 340A-C, 344A-C, those skilled in the art will readily appreciate that other numbers of inverters may be used to suit a particular design.

Like ESD power clamp 200 of FIG. 2, inverters 340A-C of inverter chain 332A of FIG. 3 are electrically connected between high-voltage pin 320 and an intermediate node 348 having a voltage between the voltages of the high-voltage pin and low-voltage pin 324. Also like ESD power clamp 200, inverters 344A-B of inverter chain 332B are electrically connected between intermediate node 348. However, ESD power clamp 300 differs from ESD power clamp 200 of FIG. 2 in that inverter 344C of inverter chain 332B is electrically connected between the output 352 of inverter chain 332A and low-voltage pin 324. In this example, intermediate node 348 is powered by a voltage divider 356, which in this case is provided by two resistor-connected PMOSFETs 360, 364 electrically connected in series between high- and low-voltage pins 320, 324. In one example, the resistances of PMOSFETs 360, 364 are identical and are equal to 500 kΩ. Consequently, the voltage on intermediate node 348 is one-half of VDD on high-voltage pin 320 (assuming ground on low-voltage pin 324 is 0V). Of course, other resistive devices and resistance values can be used. In addition, voltage divider 356 need not be symmetrical as shown.

Gate pull-up feedback circuitry 336 includes inverter 344C and an NMOSFET 368 in series with inverter 344C and diode-connected to output 352 of inverter chain 332A. As those skilled in the art will understand, NMOSFET 368 and inverter 344C connected in this manner serve as pull-up devices for bottom BigFET 316B. NMOSFET 368 can be replaced with multiple devices connected in series for voltage shifting.

In this example, trigger 312 is an RC trigger that includes a first resistor-capacitor pair 372 electrically connected between high-voltage pin 320 and intermediate node 348 and a second resistor-capacitor pair 376 electrically connected between the intermediate node and low-voltage pin 324. First resistor-capacitor pair 372 provides a trigger signal (not shown) to inverter chain 332A in response to an ESD event as a function of its RC time constant. Likewise, second resistor-capacitor pair 376 provide a trigger signal (not shown) to inverter chain 332B in response to the ESD even as a function of its RC time constant. In one example, the RC time constant for each of resistor-capacitor pair 372, 376 is about 1 μs. Those skilled in the art will understand how to select resistance and capacitance values for resistor-capacitor pairs 372, 376 to achieve suitable RC time constants for the type of ESD under consideration.

During an ESD event where high voltage pin 320 rises to high (e.g. VDD) and low voltage pin 324 stays at low (e.g. GND), The trigger circuit 372 sets the output of the upper inverter chain output 352 to be VDD, turning on 316A and 368. Resistive divider 356 at the same time pulls the intermediate node 348 up to be VDD/2, and the lower inverter chain sets its output to be the same as source node of 368. Once 368 turns on, it helps to pull the gate of transistor 316B to be VDD/2. Both BigFETs are therefore fully turned on and start to discharge ESD current.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An electrostatic discharge (ESD) protection circuit for protecting an integrated circuit chip from an ESD event, comprising:
   a BigFET stack electrically connected between a high-voltage pin and a ground pin of the integrated circuit chip, said BigFET stack including a first BigFET and a second BigFET connected in series with, and downstream of, said first BigFET without being electrically connected to a diffusion contact, said first BigFET including a first gate and said second BigFET including a second gate;

a middle node; a voltage divider electrically connected between the high-voltage pin and the ground pin, said voltage divider hiving a center node electrically connected to said middle node so that when the high-voltage pin is at a first voltage said middle node is at a second voltage that is a fraction of the first voltage a driver electrically connected to each of said first and second gates and configured to drive said first and second gates during the ESD event, wherein said driver includes:

a first inverter chain having a first output electrically connected to said first gate of said first BigFET and including a first plurality of inverters electrically connected between the high-voltage pin and said middle node, said first plurality of inverters having a first inverter output electrically connected to said first gate of said first BigFET;

a second inverter chain having a second output electrically connected to said second gate of said second BigFET and including a second plurality of inverters electrically connected between said middle node and the ground pin, said second plurality of inverters having a second inverter output electrically connected to said second gate of said second BigFET; and gate-up feedback circuitry that includes a first nFET electrically connected between the high-voltage pin and said middle node and a second nFET electrically connected between said middle node and the ground pin, wherein said first nFET has a third gate electrically connected to said first gate of said first BigFET and said second nFET has a fourth gate electrically connected to said second gate of said second BigFET; and a trigger for detecting the ESD event and triggering said driver to drive said first and second gates in response to the ESD event;

wherein, in response to said trigger triggering said drivers as a function of a third voltage applied to said high-voltage pin during the ESD event, each of said first and second nFETs turn on so as to pull up said middle node to a fourth voltage that is a fraction of said third voltage, thereby causing said first gate of said first BigFET to be at said third voltage and said second gate of said second BigFET to be at said fourth voltage.

2. The ESD protection circuit of claim 1, wherein said trigger comprises two resistor-capacitor pairs electrically connected in series with one another between the high and ground pins.

* * * * *